FLUID CIRCUIT

Filed Aug. 11, 1967 2 Sheets-Sheet 1

INVENTOR.
CHARLES W. RAINER
BY Ronald T. Reiling
ATTORNEY

INVENTOR.
CHARLES W. RAINER
BY
ATTORNEY

United States Patent Office 3,499,460

Patented Mar. 10, 1970

3,499,460

FLUID CIRCUIT

Charles W. Rainer, Anoka, Minn., assignor to Honeywell Inc., Minneapolis, Minn., a corporation of Delaware Filed Aug. 11, 1967, Ser. No. 659,964
Int. Cl. F15c 1/12
U.S. Cl. 137—81.5 5 Claims

ABSTRACT OF THE DISCLOSURE

A fluidic variable gain circuit comprising three proportional fluid amplifiers interconnected such that the outlet passages of the first amplifier supply fluid to the power nozzles of the second and third amplifiers at oppositely varying pressures. The circuit gain is changed by changing a bias pressure at control ports of the second and third amplifiers. The circuit output signal is produced between an outlet passage of the second amplifier and an outlet passage of the third amplifier.

The invention herein described was made in the course of or under a contract or subcontract thereunder, with the U.S. Air Force.

BACKGROUND OF THE INVENTION

This invention relates generally to fluid handling apparatus, and more specifically to pure fluid circuits having variable gains.

Fluid amplifiers and various other fluidic devices have been known in the art for some time. However, only recently has the fluidics art advanced to the point that complete systems utilizing fluid components are feasible. The recent interest in fluid systems design has increased the need for more flexible components and basic fluid circuits. Since many of the fluid systems of interest require means for changing system gain on command or means for generating nonlinear mathematical functions, an increasing need exists for usable variable gain circuits.

Various solutions to the problem of changing gain have previously been proposed, all of which have undesirable features. For example, a plurality of fluid amplifiers each having a different gain characteristic may be used in conjunction with switching means for selecting the desired amplifier. This technique is cumbersome, expensive and introduces undesirable time delays into the circuit in which it is used. Similarly, a special fluid amplifier having a plurality of pairs of receivers of different gain characteristics and means for deflecting the power stream to the desired receiver pair may be used. This requires a special amplifier which is expensive and difficult to manufacture. Another prior art gain changing technique involves the use of a special fluid amplifier having an interaction chamber with a special port or ports through which additional fluid may be introduced. The gain of the amplifier is changed by supplying additional fluid to its interaction chamber. In addition to the requirement for a special purpose amplifier, this technique cannot produce noise-free output signals at very low gains.

It is apparent that these prior art gain changing techniques are not generally satisfactory for use in modern refined fluid systems.

SUMMARY OF THE INVENTION

The applicant's fluidic variable gain circuit overcomes these problems of the prior art devices. In accordance with the teachings of this invention, the basic gain changing operation is accomplished with two general purpose proportional fluid amplifiers. The gain of the circuit is changed by varying the magnitude of a bias pressure common to both of the amplifiers. The circuit output is a pressure differential signal produced between an outlet channel of each of the amplifiers. At very low gains, the fluid signal in each of the outlet channels is of very low pressure and correspondingly low noise. Thus, substantially noise-free operation is produced even at extremely low gains. Further, the circuit may be provided with a wide linear operating range by the addition of a proportional input amplifier and negative feedback passages.

The applicant's unique circuit comprises first and second proportional fluid amplifiers and means for supplying a pressure differential input signal between the power nozzles thereof. In addition, variable means for biasing each of the amplifiers in an opposite sense is provided. The circuit provides a pressure differential output signal between an outlet channel of the first amplifier and the noncorresponding outlet channel of the second amplifier. The circuit output signal follows the input signal and has a magnitude which is dependent on the bias pressure supplied to the amplifiers. The means for supplying a pressure differential input signal between the power nozzles of the first and second amplifiers may be a third proportional fluid amplifier. The power nozzles of the first and second amplifiers receive fluid signals from the outlet passages of the third amplifier. The circuit input signal is then initially applied between a first pair of control ports of the third amplifier. Negative feedback paths may be provided from the unused outlet channels of the first and second amplifiers to a second pair of control ports of the third amplifier to provide the circuit with an extended linear operating range.

DESCRIPTION OF THE PREFERRED EMBODIMENTS

Figure 1:
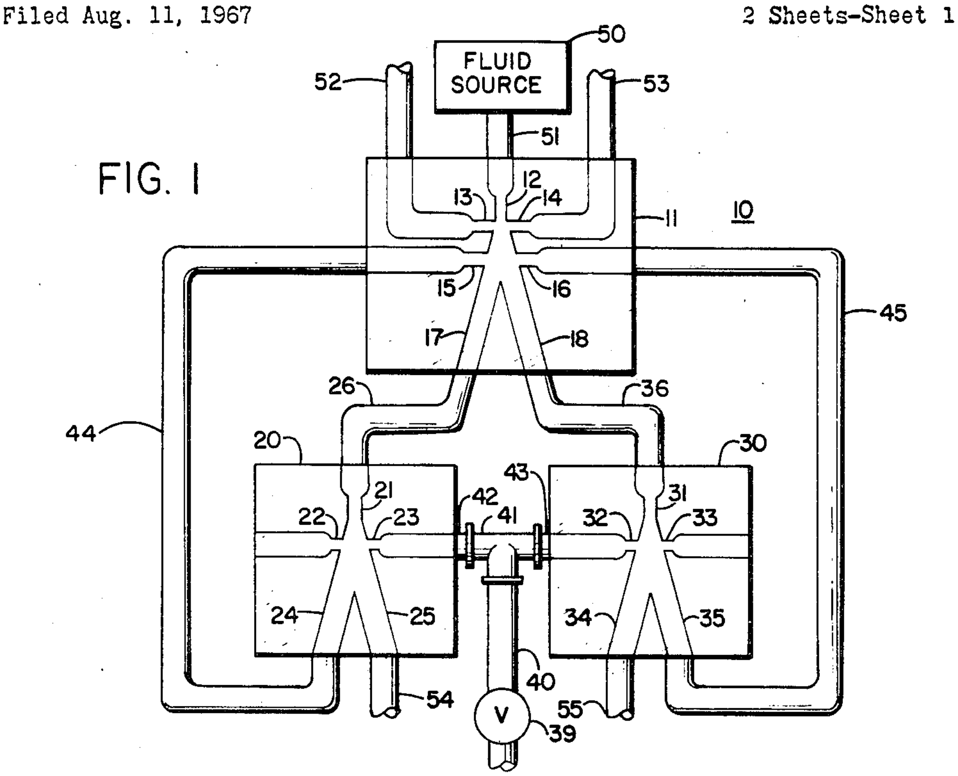
FIGURE 1 is a schematic drawing of a first embodiment of the applicant's fluidic variable gain circuit showing a first biasing arrangement.

In FIGURE 1, reference numeral 10 generally refers to one embodiment of the applicant's variable gain fluid circuit. Reference numeral 11 refers to a first proportional fluid amplifier having a power nozzle 12, a first pair of control ports 13 and 14, a second pair of control ports 15 and 16, a first outlet passage 17 and a second outlet passage 18.

Reference numeral 20 refers to a second proportional fluid amplifier having a power nozzle 21, a first control port 22, a second control port 23, a first outlet channel 24 and a second outlet channel 25. Outlet passage 17 of amplifier 11 is connected to power nozzle 21 of amplifier 20 by means of conduit 26.

Reference numeral 30 refers to a third proportional fluid amplifier having substantially the same geometry as amplifier 20. Amplifier 30 has a power nozzle 31, a first control port 32, a second control port 33, a first outlet channel 34 and a second outlet channel 35. Outlet passage 18 of amplifier 11 is connected to power nozzle 31 of amplifier 30 by means of conduit 36. Control ports 23 of amplifier 20 and 32 of amplifier 30 are connected to a fluid source (not shown) by means of valve 39, conduit 40, T junction 41 and conduits 42 and 43. Outlet channels 24 of amplifier 20 and 35 of amplifier 30 may be connected to control ports 15 and 16 of amplifier 11 by means of tubes 44 and 45 respectively to provide negative feedback paths.

Power nozzle 12 of amplifier 11 is supplied with fluid under pressure from fluid source 50 by means of conduit 51. Fluid pressure differential signals are provided to control ports 13 and 14 of amplifier 11 from any desired source (not shown) by means of conduits 52 and 53 respectively. Output pressure differential signals from circuit 10 are produced between outlet channels 25 of amplifier 20 and 34 of amplifier 30. The circuit output signals are transmitted to any desired utilization device (not shown) by means of conduits 54 and 55.

The gain of a fluidic device or circuit is defined as the ratio of the differential change in the output signal to the differential change in the input signal. There are three different gains which may be considered: (1) pressure gain, (2) flow gain and (3) power gain. For the purpose of the following discussion, only the pressure gain will be considered. It should, however, be understood that the following discussion is equally as applicable when considering flow gain or power gain. The pressure gain of the subject variable gain circuit is defined as the ratio a change the output pressure differential to the corresponding change in the input pressure differential.

Referring now to the operation of circuit 10, fluid from fluid source 50 issues as a stream from power nozzle 12. In the absence of a pressure differential between control ports 13 and 14, the fluid stream from nozzle 12 will divide substantially equally between outlet passages 17 and 18, resulting in fluid being supplied to power nozzles 21 and 31 of amplifiers 20 and 30 at substantially equal pressures. Amplifiers 20 and 30 have substantially identical geometries, control ports 23 and 32 are connected to the same bias source and are therefore supplied with substantially equal pressures, and pressures at control ports 22 and 33 are substantially equal. Therefore, fluid will flow from outlet channels 25 and 34 at substantially equal pressures. Accordingly, in the absence of a pressure differential input signal, there will be no pressure differential output signal from circuit 10.

If, however, an input signal is applied to circuit 10 such that the pressure is greater at control port 14 than at control port 13, the fluid stream issuing from nozzle 12 will be deflected such that a larger portion thereof enters outlet passage 17. As a result, fluid is supplied to amplifier 20 at a higher pressure than to amplifier 30. Due to the substantially identical geometries of amplifiers 20 and 30 and the equal bias pressures being applied thereto, the stream issuing from power nozzle 21 will divide between outlet channels 24 and 25 in substantially the same proportion as the stream issuing from power nozzle 31 divides between outlet channels 34 and 35. However, since fluid is issuing from nozzle 21 at a higher pressure than from nozzle 31, fluid will flow from channel 25 at a higher pressure than from channel 34. Thus, if a pressure differential input signal is applied to circuit 10, a pressure differential output signal will be provided therefrom.

Considering any given set of input conditions to circuit 10, the maximum pressure signal in outlet channel 25 will occur when the stream issuing from power nozzle 21 is deflected directly into outlet channel 25. Likewise, the maximum pressure signal in outlet channel 34 will occur when the stream issuing from power nozzle 31 is deflected directly into outlet channel 34. The streams issuing from power nozzles 21 and 31 can be directed toward outlet channels 25 and 34 respectively by applying a bias pressure to control ports 23 and 32 which is sufficiently lower than the pressure at control ports 22 and 33. This bias condition also results in a maximum pressure differential between outlet channels 25 and 34 and a maximum circuit gain.

Increasing the bias pressure at control nozzles 23 and 32 from the value required for maximum circuit gain causes the streams from power nozzles 21 and 31 to shift away from outlet channels 25 and 34. The result is that the pressures of the fluid signals in both outlet channels 25 and 34 decrease and the pressure differential between outlet channels 25 and 34 decreases. Correspondingly, the circuit gain decreases. The circuit gain can be reduced to zero by sufficiently increasing the bias pressure at control ports 23 and 32.

Figure 3:
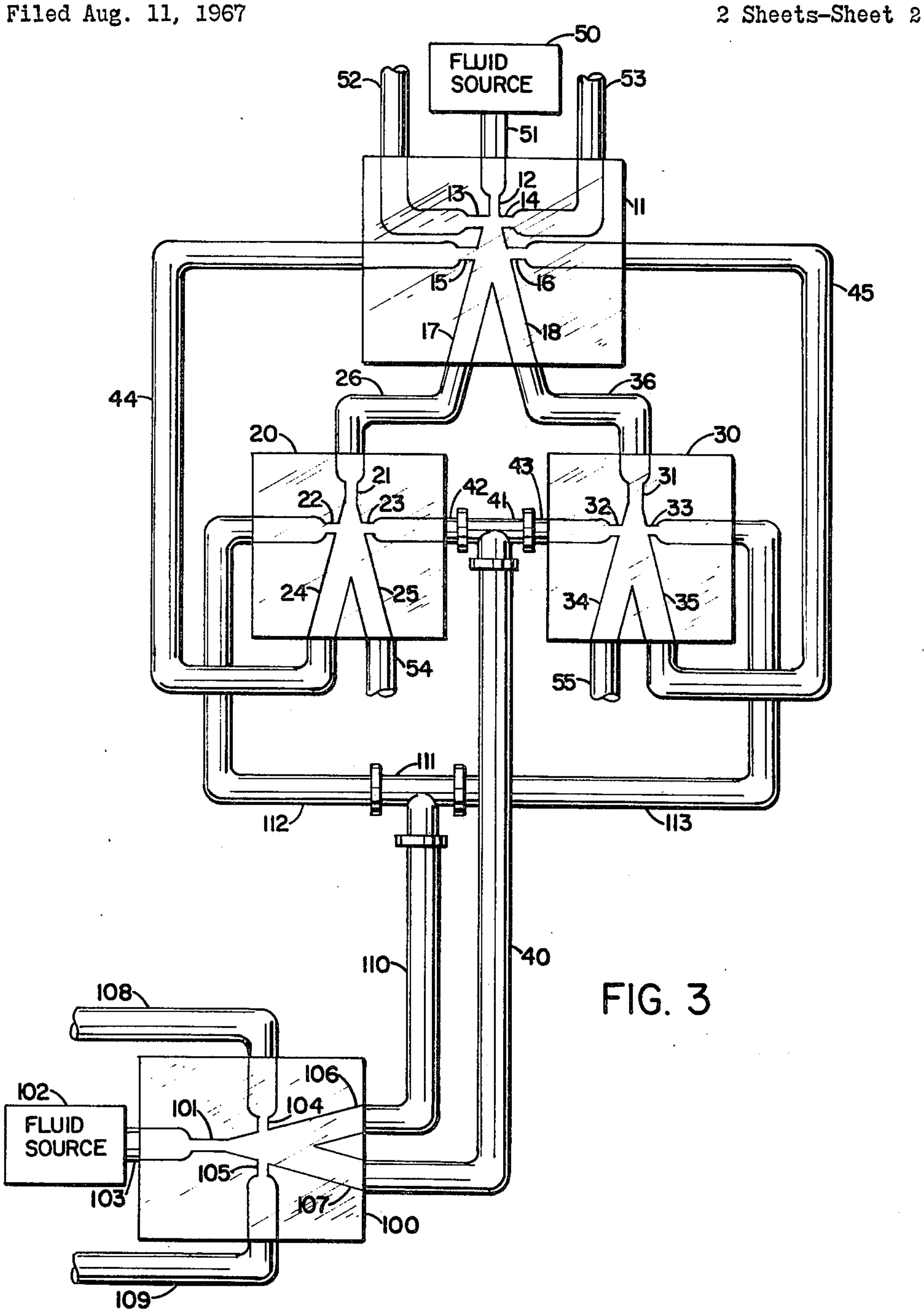
FIGURE 3 is a schematic drawing of the applicant's circuit showing an alternate biasing arrangement.

The bias pressure at control ports 23 and 32 can be varied by opening or closing valve 39 as shown in FIGURE 1. Another method of varying the bias pressure to amplifiers 20 and 30 is shown in FIGURE 3 which will subsequently be discussed. Additional methods of varying the bias pressure to amplifiers 20 and 30 will be apparent to those skilled in the art. The applicant does not wish to be limited to the illustrated methods.

Negative feedback may be provided by connecting outlet channels 24 and 35 of amplifiers 20 and 30 to control ports 15 and 16 respectively of amplifier 11 by means of tubes 44 and 45. It will be noted that if a pressure differential exists between outlet channels 25 and 34, a pressure differential also exists between outlet channels 24 and 35. This pressure differential is transmitted to control ports 15 and 16 and tends to counteract any pressure differential existing between control ports 13 and 14. However, the negative feedback portions of circuit 10, including control ports 15 and 16, are designed to be less effective at controlling the stream issuing from power nozzle 12 than control ports 13 and 14. There are a variety of ways well known in the fluidics art by which these negative feedback portions can be made less effective than control ports 13 and 14. As examples, control ports 15 and 16 may be made smaller than control ports 13 and 14 or tubes 44 and 45 may be provided with restrictions to limit the flow therethrough. Consequently, the negative feedback does not overcome the effect of the streams from control nozzles 13 and 14, but serves to increase the linear operating range and stability of circuit 10. It will be apparent to those skilled in the art that the operating characteristics of circuit 10 can be tailored for a wide range of applications by increasing or decreasing the feedback effectiveness.

It should be noted that at very low circuit gains, the magnitudes of the pressure signals in both outlet channels 25 and 34 are very small. The random pressure fluctuations in the two signals are related to the magnitudes of the signals and are also very small. Consequently, random fluctuations in the pressure differential between outlet channels 25 and 34 are very small and the circuit output signal is substantially noise-free. This is contrasted with some prior art techniques in which it was necessary to take the difference of two large but substantially equal pressure signals to obtain small gains. In these techniques, random fluctuations in the pressure signals result in considerable unavoidable noise at the smaller pressure differentials and limit the minimum usable gain.

Figure 2:
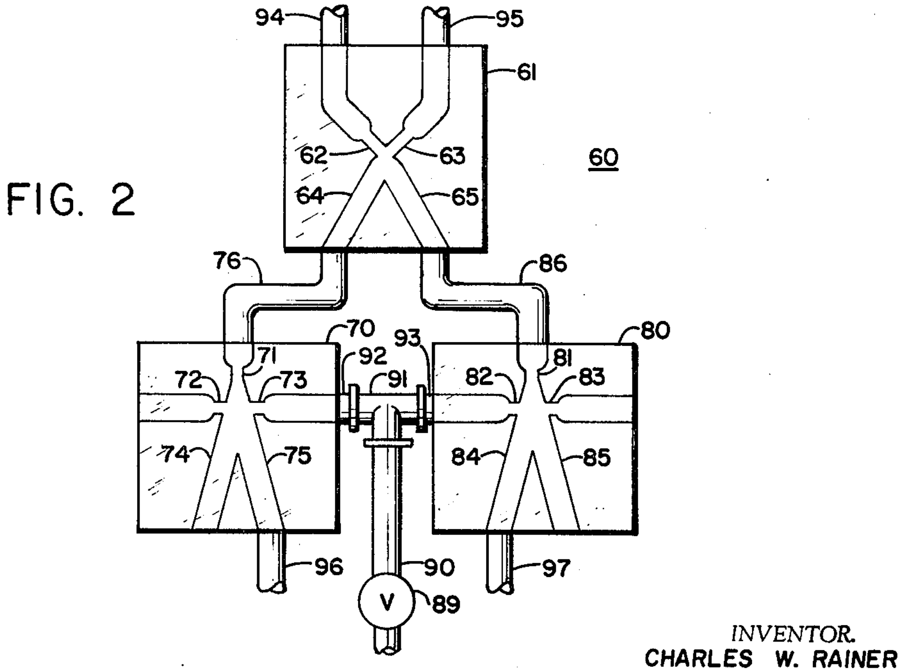
FIGURE 2 is a schematic drawing of a second embodiment of the applicant's fluidic variable gain circuit.

Referring now to FIGURE 2, reference numeral 60 generally refers to a second embodiment of a variable gain circuit in accordance with the applicant's invention. Reference numeral 61 refers to a fluid differential comparator having a first input port 62, a second input port 63, a first outlet passage 64 and a second outlet passage 65.

Reference numeral 70 refers to a first proportional fluid amplifier having a power nozzle 71, a first control port 72, a second control port 73, a first outlet channel 74 and a second outlet channel 75. Outlet passage 64 of fluid comparator 61 is connected to power nozzle 71 of amplifier 70 by means of conduit 76.

Reference numeral 80 refers to a second proportional fluid amplifier having a power nozzle 81, a first control port 82, a second control port 83, a first outlet channel 84 and a second outlet channel 85. Outlet passage 65 of fluid comparator 61 is connected to power nozzle 81 of amplifier 80 by means of conduit 86. Control ports 73 of amplifier 70 and 82 of amplifier 80 are connected to a fluid source (not shown) by means of valve 89, conduit 90, T junction 91 and conduits 92 and 93.

Fluid pressure differential input signals are provided to input ports 62 and 63 of fluid comparator 61 from any desired source (not shown) by means of conduits 94 and 95. Circuits 60 produces fluid pressure differential output signals between outlet channel 75 of amplifier 70 and 84 of amplifier 80. The output signals from circuit 60 are transmitted to any desired utilization device (not shown) by means of conduits 96 and 97.

In operation, if a fluid input pressure differential signal is supplied between input ports 62 and 63 of differential comparator 61, a pressure differential signal is produced between outlet passages 64 and 65. For example, if the angles that ports 62 and 63 make with the centerline of symmetry of comparator 61 are equal, and if the pressure at input port 63 is greater than the pressure at input port 62, the momentum interchange of the streams issuing from the ports will result in more fluid entering outlet passage 64 than enters outlet passage 65. Therefore, the pressure produced in outlet passage 64 will be greater than the pressure produced in outlet passage 65. In this way, power nozzles 71 and 81 of amplifiers 70 and 80 are supplied with fluid at different pressures. Since the pressure in outlet channels 75 and 84 of amplifiers 70 and 80 is dependent on the pressures supplied to power nozzles 71 and 81, it is apparent that the pressure differential output signal of circuit 60 taken between outlet channels 75 and 84 will follow the circuit input pressure differential signal supplied between input ports 62 and 63 of differential comparator 61. The mechanism for changing the gain in this circuit is identical with that described for circuit 10 and need not be reiterated.

It should be noted that fluid differential comparators and fluid amplifiers are not the only components which will serve to supply fluid at pressures which vary in opposite directions to power nozzles 21 and 31 of amplifiers 20 and 30 or power nozzles 71 and 81 of amplifiers 70 and 80. In fact, if the input signals to each of the amplifiers are of sufficient strength and are in the same range of magnitudes, they may be applied directly to the power nozzles of these amplifiers. The primary requirement for operation of the applicant's variable gain circuit is that fluid signals of sufficient magnitudes whose pressures vary in opposite senses be supplied to power nozzles 21 and 31 or power nozzles 71 and 81. Further, it is not essential to the operation of the present invention that amplifiers 20 and 30 or amplifiers 70 and 80 provide control of a signal by another signal of smaller magnitude. These amplifiers merely need to provide output signals which vary in proportion to the fluid signals at their control ports.

Reference is now made to FIGURE 3 which illustrates an alternate method for varying the bias pressure in the variable gain circuit of the present invention. A portion of the circuit of FIGURE 3 is identical with a portion of the circuit of FIGURE 1. Therefore, like reference numerals will be used to indicate like elements in the two figures.

In the embodiment of the applicant's variable gain circuit shown in FIGURE 3, a variable bias pressure is supplied to the control ports of amplifiers 20 and 30 by means of proportional fluid amplifier 100, conduits 40 and 110, T junctions 41 and 111 and conduits 42, 43, 112 and 113. Fluid amplifier 100 includes a power nozzle 101 adapted to be supplied with fluid from a fluid source 102 by means of conduit 103. Amplifier 100 also includes a pair of opposing control ports 104 and 105 and a pair of outlet passages 106 and 107. Control ports 104 and 105 are adapted to be supplied with a fluid pressure differential signal from any suitable control source (not shown) by means of conduits 108 and 109 respectively. The control source may, for example, be a portion of a larger fluidic circuit or system. Outlet passage 106 is connected to control port 22 of amplifier 20 and control port 33 of amplifier 30 by means of conduit 110, T junction 111 and conduits 112 and 113. Outlet passage 107 is connected to control port 23 of amplifier 20 and control port 32 of amplifier 30 by means of conduit 40, T junction 41 and conduits 42 and 43.

The basic operation of the variable gain circuit of FIGURE 3 is the same as that of FIGURE 1 and need not be reiterated. However, the method of changing the bias pressure to amplifiers 20 and 30 and causing the circuit to change gain differs from that of FIGURE 1 and will now be discussed.

In the absence of a pressure differential between control ports 104 and 105 of amplifier 100, a fluid stream issuing from power nozzle 101 will divide such that substantially equal pressures are produced in outlet passages 106 and 107. The substantially equal pressures in outlet passages 106 and 107 will be supplied to control ports 22 and 23 of amplifier 20 and control ports 32 and 33 of amplifier 30. This condition has essentially the same effect as if no bias pressure is supplied to amplifiers 20 and 30 and results in an intermediate circuit gain.

If the control signal to amplifier 100 is such that the pressure in control port 104 is greater than that in control port 105, the pressure in outlet passage 107 will be greater than that in outlet passage 106. Accordingly, the pressure at control ports 23 and 32 will be greater than that at control ports 22 and 33 and the streams issuing from power nozzles 21 and 31 will be deflected away from outlet channels 25 and 34 of amplifiers 20 and 30 respectively. This condition results in reduced circuit gain as hereinbefore discussed.

Conversely, if the control signal to amplifier 100 is such that the pressure in control port 105 is greater than that in control port 104, the pressure in outlet passage 106 will be greater than that in outlet passage 107. The pressure at control ports 22 and 33 will, therefore, be greater than the pressure at control ports 23 and 32 of amplifiers 20 and 30 respectively. Correspondingly, the streams issuing from power nozzles 21 and 31 will be deflected toward outlet channels 25 and 34 resulting in increased circuit gain. Accordingly, it can be seen from FIGURE 3 that the gain of the illustrated embodiment of the applicant's variable gain circuit can be varied between zero and its maximum value by supplying the proper control pressure to control ports 104 and 105 of amplifier 100.

All the components used in the variable gain circuit of the applicant's invention are simple general purpose devices. Further, although two different types of proportional fluid amplifiers are shown in FIGURES 1 and 3 the use of two different types of proportional amplifiers is not necessary. All of the amplifiers used in these circuits may be identical.

I claim:

1. A variable gain fluid circuit comprising:

a first proportional fluid amplifier having a power nozzle, first and second control ports and first and second outlet passages;

a second proportional fluid amplifier having a power nozzle, a first control port and first and second outlet channels;

means connecting the first outlet passage of said first amplifier to the power nozzle of said second amplifier;

a third proportional fluid amplifier having a power nozzle, a first control port and first and second outlet channels;

means connecting the second outlet passage of said first amplifier to the power nozzle of said third amplifier; and bias means connected to the first control ports of said second and third amplifiers for supplying fluid thereto at a common variable pressure, whereby fluid output signals are produced between the second outlet channel of said second amplifier and the first outlet channel of said third amplifier, the sense of the fluid output signals conforming to the sense of a fluid input signal between the first and second input ports of said first amplifier, the magnitude of the fluid output signals being dependent on the pressure supplied to the control ports of said second and third amplifiers.

2. The variable gain circuit of claim 1 wherein:

said first amplifier is provided with third and fourth control ports;

negative feedback means connecting the first outlet channel of said second amplifier to the third control port of said first amplifier is provided; and negative feedback means connecting the second outlet channel of said third amplifier to the fourth control port of said first amplifier is provided, thereby providing negative feedback to increase the linear operating range of the variable gain fluid circuit.

3. The variable gain circuit of claim 2 wherein said second and said third proportional fluid amplifiers each have a second control port and said bias means includes a fourth propertional fluid amplifier connected to the first and second control ports of said second and third proportional fluid amplifiers.

4. A fluid circuit comprising:

a first proportional fluid amplifier having a power nozzle, a control port and first and second outlet channels;

a second proportional fluid amplifier having a power nozzle, a control port and first and second outlet channels;

input means connected to the power nozzles of said first and said second amplifiers for supplying fluid input pressure differential signals therebetween, said input means comprising a fluid differential comparator having first and second input ports and first and second outlet passages, the first and second outlet passages being connected to the power nozzles of said first and second proportional amplifiers respectively; and bias means connected to the control ports of said first and second amplifiers for supplying fluid thereto at a common variable pressure, whereby fluid output signals are produced between the second outlet channel of said first fluid amplifier and the first outlet channel of said second fluid amplifier, the magnitude of the output signals being dependent on the magnitude of the input signals and the pressure supplied to the control ports of said first and second amplifiers.

5. The variable gain circuit of claim 4 wherein said bias means includes a third proportional fluid amplifier.

References Cited

UNITED STATES PATENTS

| | | | |
|---|---|---|---|
| 3,093,306 | 6/1963 | Warren | 137—81.5 XR |
| 3,117,593 | 1/1964 | Somers | 137—81.5 XR |
| 3,180,575 | 4/1965 | Warren | 137—81.5 XR |
| 3,199,782 | 8/1965 | Shinn | 137—81.5 XR |
| 3,238,959 | 3/1966 | Bowles | 137—81.5 |
| 3,338,515 | 8/1967 | Dexter | 137—81.5 XR |

SAMUEL SCOTT, Primary Examiner